United States Patent
Fan

(10) Patent No.: US 8,909,178 B2
(45) Date of Patent: Dec. 9, 2014

(54) METHOD, RF MODULE AND TEST METHOD FOR ENABLING POWER AMPLIFIER TO SUPPORT MULTIPLE POWERS

(75) Inventor: Qinhuai Fan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 491 days.

(21) Appl. No.: 12/334,962

(22) Filed: Dec. 15, 2008

(65) Prior Publication Data

US 2009/0093225 A1 Apr. 9, 2009

Related U.S. Application Data

(63) Continuation of application No. PCT/CN2007/070075, filed on Jun. 1, 2007.

(30) Foreign Application Priority Data

Jun. 16, 2006 (CN) .......................... 2006 1 0087092

(51) Int. Cl.
| | | |
|---|---|---|
| H04B 1/04 | (2006.01) | |
| H03G 3/30 | (2006.01) | |
| H03F 1/02 | (2006.01) | |
| H03F 3/24 | (2006.01) | |
| H03G 3/00 | (2006.01) | |

(52) U.S. Cl.
CPC .......... *H03G 3/30* (2013.01); *H04B 2001/0416* (2013.01); *H03F 1/0211* (2013.01); *H03F 3/24* (2013.01); *H03F 2200/451* (2013.01); *H03G 3/004* (2013.01); *H03G 3/3042* (2013.01); *H03G 2201/702* (2013.01); *H03G 2201/704* (2013.01)
USPC .................. 455/127.1; 455/127.2; 455/115.1; 455/126; 455/103

(58) Field of Classification Search
CPC ................ H03F 1/0211; H03F 1/3241; H03G 2201/702; H03G 2201/704; H04B 2001/0416
USPC ............. 455/115.1, 126, 127.1, 127.2, 127.4, 455/67.11
See application file for complete search history.

(56) References Cited

U.S. PATENT DOCUMENTS

| | | | |
|---|---|---|---|
| 4,866,714 A | | 9/1989 | Adams et al. |
| 5,257,415 A | * | 10/1993 | Kumagai et al. ............... 455/126 |

(Continued)

FOREIGN PATENT DOCUMENTS

| | | |
|---|---|---|
| CN | 1326609 A | 12/2001 |
| CN | 1399138 A | 2/2003 |

(Continued)

OTHER PUBLICATIONS

Written Opinion of the International Searching Authority in corresponding PCT Application No. PCT/CN2007/070075 (Aug. 30, 2007).

(Continued)

*Primary Examiner* — Duc M Nguyen
(74) *Attorney, Agent, or Firm* — Leydig, Voit & Mayer, Ltd.

(57) ABSTRACT

A method for enabling a power amplifier to support multiple powers includes: calculating a transmit power, according to RF parameters delivered by a baseband board, determining a power amplifier voltage according to the transmit power and a corresponding relationship between the transmit power and the power amplifier voltage, and adjusting a supply voltage of the power amplifier, according to the determined power amplifier voltage, so as to adjust an output power of the power amplifier. A RF module includes a conversion module that converts a baseband board signal into a RF signal, an antenna linear device, a storage module, a power amplifier module, an adjustable power module, and a power control module. A test method is employed to determine the relationship between a transmit power and a power amplifier voltage.

12 Claims, 3 Drawing Sheets

(56) References Cited

U.S. PATENT DOCUMENTS

| | | | |
|---|---|---|---|
| 5,363,333 | A | 11/1994 | Tsujimoto |
| 5,603,106 | A * | 2/1997 | Toda .............................. 455/126 |
| 5,655,220 | A * | 8/1997 | Weiland et al. ................. 455/69 |
| 5,737,697 | A * | 4/1998 | Yamada ........................ 455/126 |
| 6,043,707 | A * | 3/2000 | Budnik ........................... 330/10 |
| 6,055,418 | A * | 4/2000 | Harris et al. .................... 455/91 |
| 6,069,525 | A * | 5/2000 | Sevic et al. ..................... 330/51 |
| 6,141,541 | A | 10/2000 | Midya et al. |
| 6,194,963 | B1 | 2/2001 | Camp, Jr. et al. |
| 6,216,100 | B1 * | 4/2001 | Meghdadi et al. .............. 703/15 |
| 6,377,784 | B2 | 4/2002 | McCune |
| 6,677,819 | B1 * | 1/2004 | Hakala et al. ................. 330/136 |
| 6,847,904 | B2 * | 1/2005 | Blake et al. ..................... 702/57 |
| 7,110,727 | B2 * | 9/2006 | Dekker ........................... 455/91 |
| 7,183,844 | B2 * | 2/2007 | Klomsdorf et al. ........... 330/129 |
| 7,224,215 | B2 * | 5/2007 | Osborn .............................. 330/2 |
| 7,333,563 | B2 * | 2/2008 | Chan et al. .................... 375/297 |
| 7,440,733 | B2 * | 10/2008 | Maslennikov et al. .... 455/114.3 |
| 7,522,892 | B2 * | 4/2009 | Dupuis ....................... 455/127.1 |
| 7,962,108 | B1 * | 6/2011 | Khlat et al. ................ 455/114.3 |
| 2001/0012765 | A1 * | 8/2001 | Noreus et al. ................... 455/69 |
| 2002/0142741 | A1 * | 10/2002 | Molnar et al. ................. 455/127 |
| 2004/0038701 | A1 * | 2/2004 | Lin ................................ 455/522 |
| 2004/0127173 | A1 | 7/2004 | Leizerovich |
| 2004/0180686 | A1 | 9/2004 | Naayama |
| 2004/0266366 | A1 * | 12/2004 | Robinson et al. ............... 455/91 |
| 2005/0110562 | A1 * | 5/2005 | Robinson et al. ............... 330/10 |
| 2005/0118965 | A1 * | 6/2005 | Tanabe et al. .............. 455/127.1 |
| 2005/0186923 | A1 | 8/2005 | Chen et al. |
| 2006/0046668 | A1 * | 3/2006 | Uratani et al. ............. 455/127.5 |
| 2009/0088093 | A1 * | 4/2009 | Nentwig .................... 455/114.3 |
| 2010/0073088 | A1 * | 3/2010 | Wimpenny et al. ........... 330/199 |

FOREIGN PATENT DOCUMENTS

| | | |
|---|---|---|
| CN | 1474517 A | 2/2004 |
| CN | 1983851 B | 7/2010 |
| EP | 0 590 651 A2 | 4/1994 |
| WO | WO 00/48307 A1 | 8/2000 |
| WO | WO 00/48307 A8 | 8/2000 |

OTHER PUBLICATIONS

International Searching Authority in corresponding PCT Application No. PCT/CN2007/070075 (Aug. 30, 2007).

1st Office Action in corresponding Chinese Application No. 200610087092.7 (May 8, 2009).

2nd Office Action in corresponding Chinese Application No. 200610087092.7 (Jan. 8, 2010).

1st Office Action in corresponding European Application No. 07721697.6 (Apr. 1, 2009).

Partial European Search Report in corresponding European Application No. 11160461.7 (Jun. 8, 2011).

"AGC Amplifier," SN761663, <http://www.ti.com.cn/cn/lit/ds/sles151/sles151.pdf>, Texas Instruments, Inc. (2005).

* cited by examiner

US 8,909,178 B2

METHOD, RF MODULE AND TEST METHOD FOR ENABLING POWER AMPLIFIER TO SUPPORT MULTIPLE POWERS

CROSS-REFERENCE TO RELATED APPLICATIONS

This application is a continuation of International Patent Application No. PCT/CN2007/070075, filed Jun. 1, 2007, which claims priority to Chinese Patent Application No. 200610087092.7, filed Jun. 16, 2006, both of which are hereby incorporated by reference in their entirety.

FIELD OF THE INVENTION

The present invention relates to a Radio Frequency (RF) technology, and more particularly, to a method, a RF module, and a test method for enabling a power amplifier to support multiple powers.

BACKGROUND

Currently, in a base station, a RF module receives the downlink data distributed by a baseband board. The downlink data is processed in the RF module, and becomes a RF signal. The process to downlink data includes shaping filter, digital up-conversion, digital-to-analog conversion (DAC), amplification of Intermediate Frequency (IF) analog signals, and up-conversion of analog signals. The RF signal is then amplified by a power amplifier before being transmitted to an antenna.

In the prior art, the RF module includes a conversion module that converts a baseband board signal into a RF signal, a storage module, a control module, a power amplifier module, a power module, and an antenna linear device.

The conversion module that converts a baseband board signal into a RF signal converts the downlink data distributed by the baseband board into a RF signal. The storage module stores the manufacturing information about the RF module, such as the information about the hardware version; the control module reads and resolves the information about the hardware version stored in the storage module, and determines the power supported by the power amplifier module. The power amplifier module amplifies the received signal, and transmits the signal to an antenna through the antenna linear device. The power module supplies power to the power amplifier module, which outputs a fixed voltage to the power amplifier module, and ensures that the power amplifier module amplifies the signal, based on the power supported by the power amplifier module.

When the RF module is manufactured, the production equipment writes the manufacturing information into the RF module. The information about the hardware version includes a byte indicating the power amplification capability of the module. The byte records the power supported by the RF module, for example, 20 W. When the RF module works, the control module of the RF module reads and resolves the byte to know the power amplification capability of the RF module. When the RF module transmits the signal, the maximum power is the maximum capability of power amplification.

Therefore, the power amplification capability of the RF module depends on the manufacturing information, which needs to be written precisely by the production equipment. Once the power amplification capability supported by the RF module is determined, the RF module can work with only the power amplifier module that supports the maximum power. In the RF module, the voltage provided to the power amplifier module is a fixed value. If the power amplifier modules which support different powers are used, these power amplifier modules may be burnt due to overlarge input voltages. In particular, if these power amplifier modules are improperly assembled during production, they are more likely to be burnt.

According to meet the requirements of different operators, the RF module of a base station needs to be supported by power amplifier modules with multiple powers. Therefore, the power amplifier modules with multiple powers needs to developed to meet the different application requirement. However, the power amplifier modules with multiple powers have different requirements on manufacturing, testing, and processes. Too many different types and numbers of the power amplification products reduce the productivity, and increase burden on the development and maintenance.

SUMMARY

Accordingly, an embodiment of the present invention provides a method for enabling a power amplifier to support multiple powers, and a RF module capable of enabling a power amplifier to support application requirements for different transmit powers. Another embodiment of the present invention also provides a test method for determining a corresponding relationship between a transmit power and a power amplifier voltage.

The method for enabling a power amplifier to support multiple powers includes: receiving RF parameters delivered by a baseband board, and calculating a transmit power, according to the RF parameters; determining a power amplifier voltage, according to the transmit power and a determined corresponding relationship between the transmit power and the power amplifier voltage; and adjusting a supply voltage of the power amplifier, according to the determined power amplifier voltage, so as to adjust an output power of the power amplifier.

The RF module includes a conversion module that converts a baseband board signal into a RF signal, an antenna linear device, and a power amplifier module. The RF module further includes an adjustable power module, a storage module, and a power control module.

The storage module stores the RF parameters delivered by the baseband board and the corresponding relationship between the transmit power and the power amplifier voltage.

The power control module calculates the transmit power, according to the RF parameters stored in the storage module; determines the power amplifier voltage, according to the calculated transmit power and the corresponding relationship between the transmit power and the power amplifier voltage; and adjusts an output voltage of the adjustable power module, according to the determined power amplifier voltage.

The test method includes: calibrating the power amplifier module and the RF module to obtain a corresponding relationship between transmit power and power amplifier voltage; and performing, by a production equipment, index item test on the RF module, according to the power amplifier voltages corresponding to obtained different transmit powers after an aging treatment of the RF module.

It is determined whether the index item tests satisfy specifications, and the power amplifier voltages corresponding to the different transmit powers are adjusted, according to results of the index item tests, and the corresponding relationship between the transmit power and the power amplifier voltage is updated by the use of the adjusted power amplifier voltages.

As disclosed by the above technical schemes, in the embodiments of the present invention, the corresponding relationship between the transmit power and the power amplifier voltage is determined by the test method of the present invention. Then, the determined corresponding relationship is stored in the RF module. The power module is set to be an adjustable power module. The RF module calculates the transmit power, according to the received RF parameters delivered by the baseband board; determines the power amplifier voltage, according to the calculated transmit power and the corresponding relationship between the transmit power and the power amplifier voltage stored in the RF module; and adjusts the output power of the adjustable power module, according to the determined power amplifier voltage, so as to adjust the output power of the power amplifier module, i.e. the transmit power of the RF module. Thus, the power amplifier can support multiple powers.

DETAILED DESCRIPTION

In order to make the objectives, technical schemes, and beneficial effects of the present invention more understandable, the present invention is described in more detail below by reference to the accompanying drawings and embodiments.

In an embodiment of the present invention, the corresponding relationship between the transmit power and the power amplifier voltage is first determined, and then stored in the RF module, and the power module in the RF module is replaced by an adjustable power module. The RF module receives the RF parameters delivered by the baseband board; calculates the transmit power, according to the received RF parameters; and determines the power amplifier voltage, according to the calculated transmit power and the corresponding relationship between the transmit power and the power amplifier voltage stored in the RF module. The supply voltage of the power amplifier is adjusted according to the determined voltage, so as to adjust the output power of the power amplifier.

In this embodiment, the method of the RF module determining the power amplifier voltage according to the calculated transmit power and the corresponding relationship between the transmit power and the power amplifier voltage stored in the RF module specifically includes: the RF module queries the list in which the corresponding relationship between the transmit power and the power amplifier voltage is stored and reads the power amplifier voltage corresponding to the calculated transmit power. If the query and reading succeeds, the read power amplifier voltage is determined to be the power amplifier voltage; and if the query and reading fails, the preset default value is determined to be the power amplifier voltage.

Figure 1:
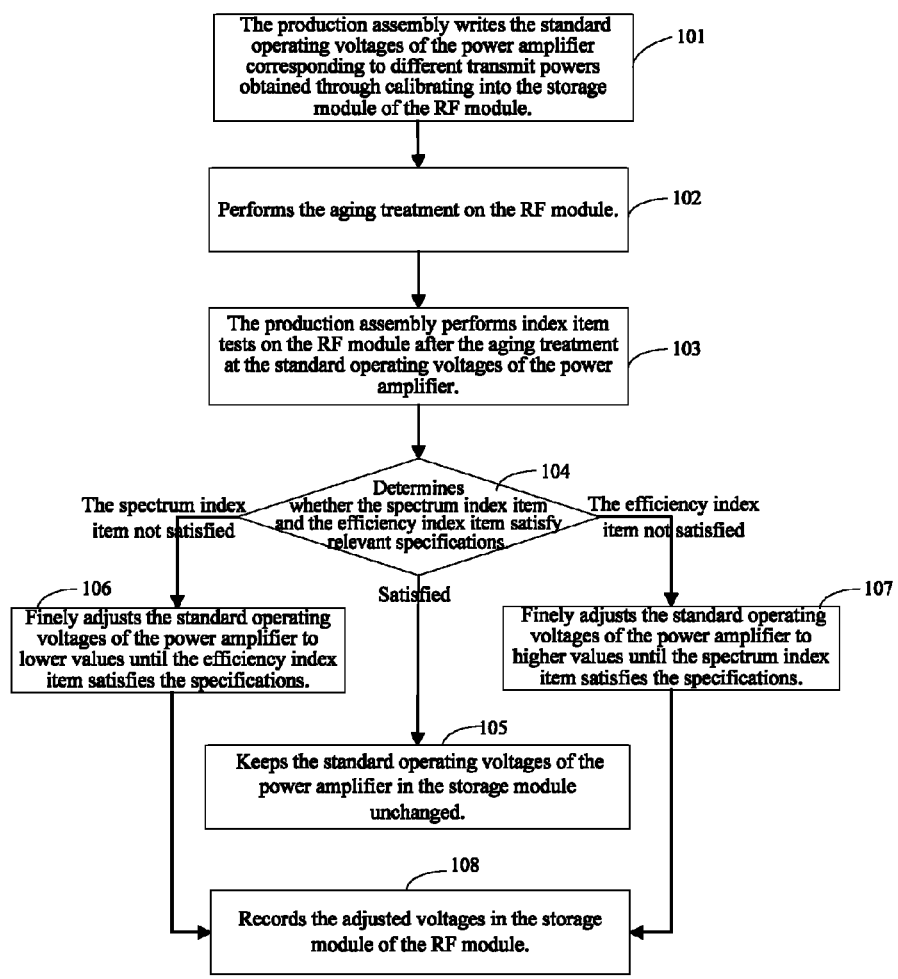
FIG. 1 is a flow chart for determining a corresponding relationship between the transmit power and the power amplifier voltage, according to an embodiment of the present invention.

FIG. 1 is a flow chart for determining a corresponding relationship between the transmit power and the power amplifier voltage, according to an embodiment of the present invention, which includes the following steps.

Step 101: Production equipment calibrates the power amplifier module and the RF module under the configuration of the tested RF module, and the obtained corresponding relationship between RF power and standard operating voltage of the power amplifier is written into the storage module of the RF module, namely, the different RF powers and the standard operating voltages of the power amplifier corresponding to the RF powers are written into the storage module of the RF module.

For the convenience of use, a table of voltage parameters of the power amplifier can be generated, and the corresponding relationship between the transmit power and the standard operating voltage of the power amplifier obtained after calibrating can be written into the table of voltage parameters of the power amplifier.

Step 102: An aging treatment is performed on the RF module.

Step 103: The production equipment performs index item tests on the RF module after the aging treatment under the standard operating voltages, stored in the RF module, of the power amplifier corresponding to different transmit powers. The index item tests include a spectrum index item test and an efficiency index item test.

In Step 104, the production equipment determines whether the spectrum index item and the efficiency index item tested under all the standard operating voltages of the power amplifier satisfy relevant specifications. If the two index items satisfy the specifications, Step 105 is performed. If the spectrum index item tested under some standard operating voltages of the power amplifier does not satisfy the specifications, Step 106 is performed. If the efficiency index item tested at some standard operating voltages of the power amplifier does not satisfy the specifications, Step 107 is performed.

Step 105: The corresponding relationship between the RF power and the standard operating voltage of the power amplifier stored in the storage module of the RF module is kept unchanged.

Step 106: The production equipment finely adjusts the standard operating voltages under which the tested spectrum index item does not satisfy the specifications to lower values, until the spectrum index item satisfies the specifications, and then Step 108 is performed.

Step 107: The production equipment finely adjusts the standard operating voltages of the power amplifier under which the tested efficiency index item does not satisfy the specifications to higher values until the efficiency index item satisfies the specifications.

Step 108: The production equipment updates the corresponding relationship between the transmit power and the power amplifier voltage stored in the RF module, according to the power amplifier voltages obtained through the adjustment in Step 106 or 107.

In order to improve the production efficiency, the written and adjusted corresponding relationship between the RF power and the power amplifier voltage needs to be maintained and updated periodically. The corresponding relationship between the RF power and the power amplifier voltage of the RF modules produced in a batch has a data standard, which exhibits the trend of the corresponding relationship between the RF power and the power amplifier voltage. Normally, the corresponding relationship between the RF power and power amplifier voltage of the RF modules produced in a production batch is basically the same, and a batch lasts several months. Therefore, if the corresponding relationship between the RF power and the power amplifier voltage of the RF modules produced in the batch is updated in time, the RF modules produced later will need less adjustment, which improves the production efficiency.

For the convenience of use, a table of voltage parameters of the power amplifier can be generated, and the corresponding relationship between the RF power and the power amplifier voltage can be written into the table of voltage parameters of the power amplifier. The table of voltage parameters of the power amplifier is maintained and updated periodically.

Figure 2:
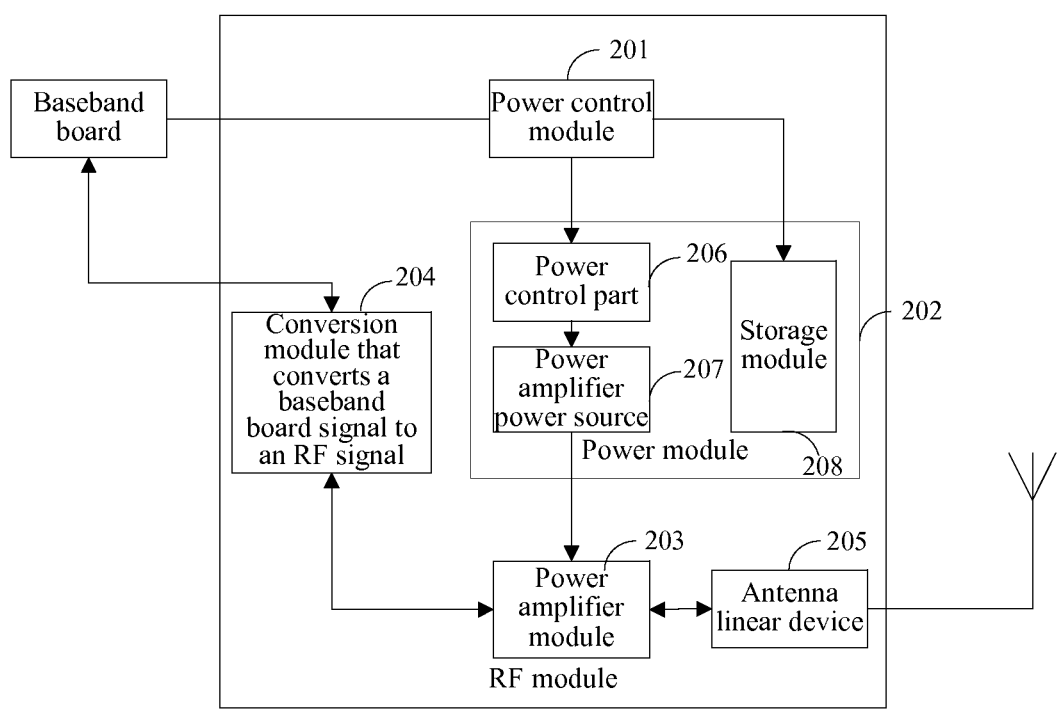
FIG. 2 is a structural view of an exemplary embodiment of a RF module of the present invention.

FIG. 2 is a structural view of a preferred embodiment of the RF module that enables a power amplifier to support multiple powers of the present invention. Referring to FIG. 2, the RF module includes a power control module 201, a power module 202, a power amplifier module 203, a conversion module 204 that converts a baseband board signal into a RF signal, and an antenna linear device 205.

The conversion module 204 that converts a baseband signal into a RF signal is adapted to convert downlink data delivered by the baseband board into a RF signal. The antenna linear device 205 is adapted to transmit the RF signal amplified by the power amplifier module to the antenna.

The power module 202 is an adjustable power module, and includes a power control portion 206, a power amplifier power source 207, and a storage module 208. In this embodiment, the power control portion 206 can be a parameter-adjustable chip.

The storage module 208 is connected to the power control module 201 through a bus. The power control portion 206 of the power module 202 is connected to the power control module 201 through the bus. The power amplifier power source 207 is connected to the power control portion 206 through a power cable. The power amplifier power source 207 is connected to the power amplifier module 203, and supplies power to the power amplifier module 203.

The storage module 208 stores a parameter carrier n, a power level Ln per carrier, a switch value of the power-saving mode, the table of voltage parameters written into the RF module by the production equipment and information about the power module 202, including coefficients for calculating a voltage control parameter, which are received by the RF module from the baseband board.

The power control portion 206 of the power module 202 is adapted to set the voltage control parameter output from the power control module 201 to the output voltage of the power amplifier power source 207.

The functions of the power control module 201 include:

1) Obtaining the switch value of the power-saving mode from the storage module 208 to determine whether to enable the power-saving mode, that is, whether to select the power amplifier that supports multiple functions. The switch value of the power-saving mode is a hexadecimal software tag. Normally, the value 0 indicates that the power-saving mode is disabled, and the value 1 indicates that the power-saving mode is enabled.

2) Determining whether it is necessary to calculate the transmit power based on the RF parameters stored in the storage module 208, according to the switch value of the power-saving mode obtained from the storage module 208, and determining the mode of reading the power amplifier voltage in the table of voltage parameters of the power amplifier. If the reading succeeds, the power amplifier voltage, for example, Vout is set to the read voltage; otherwise, the power amplifier voltage Vout is set to the default value.

3) Reading the values of the coefficients, the coefficients for calculating a voltage control parameter K and B, for calculating the voltage control parameter from the storage module 208 of the power module. If the reading fails, the coefficients for calculating a voltage control parameter K and B are set to the default values. Then, the voltage control parameter is calculated with the formula Vc=K×Vout+B, based on the determined values of the coefficients for calculating a voltage control parameter K and B.

4) Outputting the obtained voltage control parameter to the power control portion 206, and set to be the output voltage of the power amplifier power source 207 through the power control portion 206, so as to control the output voltage of the power control power source.

In this embodiment, the storage module 208 is disposed in the power module 202. In actual applications, the storage module 208 may also be disposed outside the power module 202, or a part of the storage module 208 is disposed in the power module 202, and the other part is disposed outside the power module 202.

Figure 3:
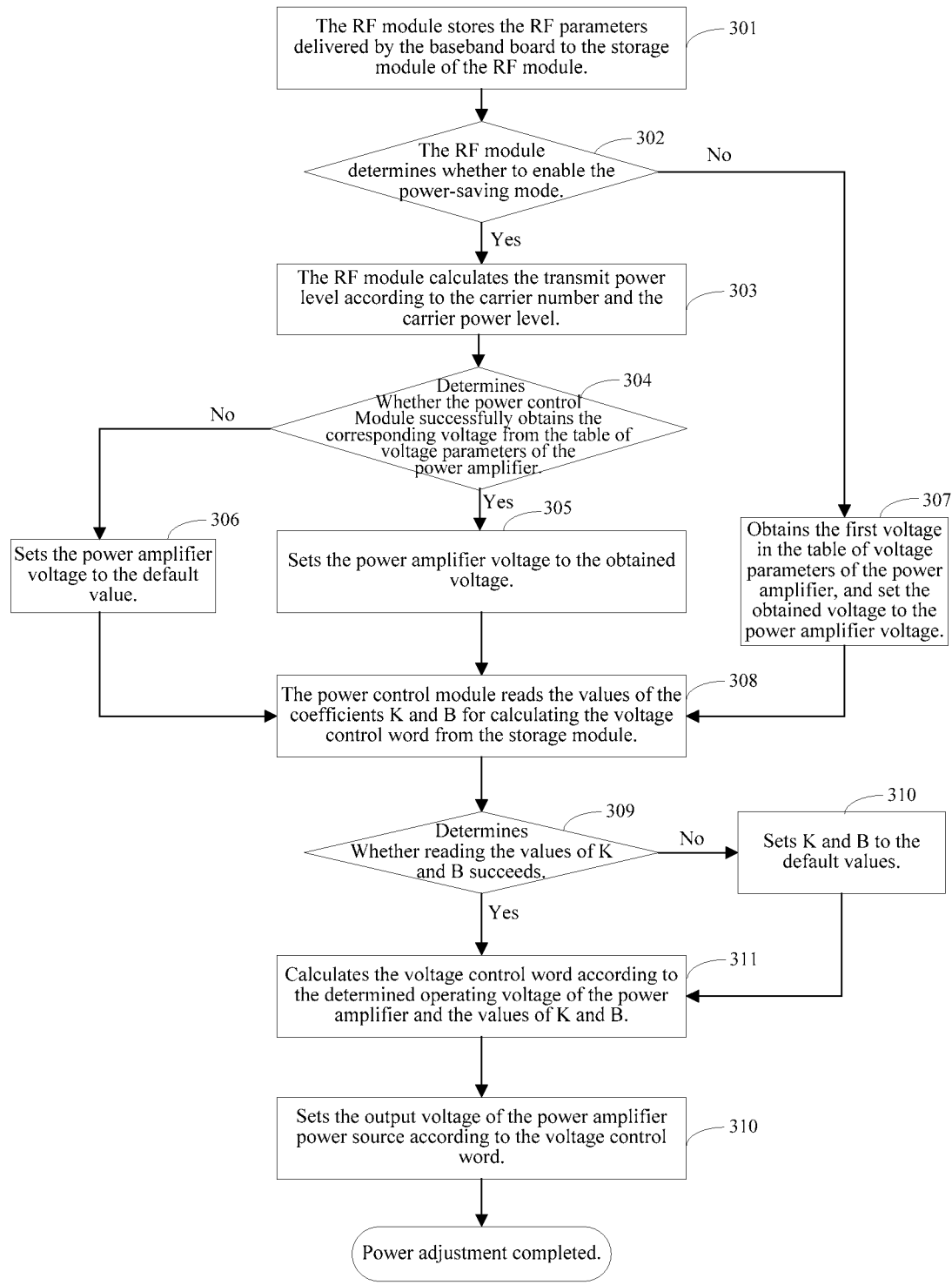
FIG. 3 is a flow chart of an exemplary embodiment of a method for enabling a power amplifier to support multiple powers of the present invention.

FIG. 3 is a flow chart of a preferred embodiment of a method for enabling a power amplifier to support multiple powers of the present invention. Referring to FIG. 3, this method uses the method shown in FIG. 1. The table of voltage parameters of the power amplifier in which the corresponding relationship between the RF power and the power amplifier voltage is written is stored in the storage module of the RF module in advance. The method includes the following steps.

Step 301: The RF module receives the RF parameters delivered by the baseband board, including the parameter carrier n, the power level Ln per carrier, and the switch value of the power-saving mode, and stores the parameters in the storage module thereof.

Step 302: The power control module obtains the switch value of the power-saving mode from the storage module, and determines whether to enable the power-saving mode.

The switch value of the power-saving mode is a hexadecimal software tag delivered by the baseband board. Normally, the value 0 indicates that the power-saving mode is disabled, and the value 1 indicates that the power-saving mode is enabled. If the power-saving mode is disabled, Step 307 is performed; otherwise, Step 303 is performed.

Step 303: The power control module calculates the transmit power, according to the RF parameters stored in the storage module. In this embodiment, the RF parameters include the carrier number and the carrier power level, and the process of calculating the transmit power is to calculate the transmit power level.

Provided that the transmit power level is L, which can be calculated with the formula L=−100×log(10^(L1/(−100))+ . . . +10^(Ln/(−100))). Here, the values of L1 to Ln range from 0 to 100.

The prerequisite for the transmit power level to represent the transmit power is that the power amplifier voltages corresponding to the transmit power levels are stored during calibrating, that is, the different transmit power levels and the corresponding power amplifier voltages are stored in the table of voltage parameters of the power amplifier.

Step 304: The power control module queries a corresponding power amplifier voltage in the table of voltage parameters of the power amplifier stored in the storage module, according to the obtained transmit power level. If the query succeeds, Step 305 is performed; otherwise, Step 306 is performed.

Step 305: The power control module sets the power amplifier voltage Vout to the queried power amplifier voltage. Then, Step 308 is performed.

Step 306: The power control module sets the power amplifier voltage Vout to the default value. Then, Step 308 is performed.

Step 307: The power control module reads the first power amplifier voltage in the table of voltage parameters of the power amplifier stored in the storage module, and sets the power amplifier voltage Vout to the value.

Steps 308 and 309, the power control module reads the values of the coefficients for calculating a voltage control parameter K and B from the storage module. If the reading succeeds, Step 311 is performed; otherwise, Step 310 is performed.

Step 310: The power control module sets the coefficients for calculating a voltage control parameter K and B to the default values.

The storage module is normally an E2PROM, which is a physical component. The E2PROM may become invalid due to the limitation on reading/writing times, or may have an exception because the bus is busy, which result in the failure of the power control module reading the E2PROM. Therefore, in order to ensure the continuity of the implementation process of the power control module, the default values of K and B are set in the power control module. When the power control module fails to read K and B, the default values are used in the calculation.

Step 311: The power control module calculates the voltage control parameter Vc based on the values of K and B determined in Steps 308 and 309, the power amplifier voltage Vout set in Step 305, 306, or 307, and the formula Vc=K×Vout+B, and outputs the voltage control parameter Vc to the power control portion of the power module.

Step 312: The power control portion of the power module sets the value of the voltage control parameter Vc obtained in Step 311 to the output voltage of the power amplifier power source, so as to adjust the voltage of the power amplifier power source.

After the voltage of the power amplifier power source is adjusted, according to the formula Power=Input voltage× Input current, in the situation that the input current of the power amplifier module remains unchanged, the power of the power amplifier module can be adjusted by adjusting the input voltage of the power amplifier module.

It is known from the above embodiments that the RF module and the power amplifier module are calibrated, the corresponding relationship between the transmit power and the power amplifier voltage is obtained after the aging treatment and index item tests, and the corresponding relationship is stored in the RF module. Meanwhile, the power control module is disposed in the RF module, and the power module in the RF module is set to an adjustable power module, such that the RF module can adjust the supply voltage of the power amplifier module, according to the obtained transmit power and the stored power amplifier voltages corresponding to different transmit powers. Further, the power amplifier can support multiple powers.

In addition, the test method provided in an embodiment of the present invention can update the corresponding relationship between the transmit power and the power amplifier voltage stored in the RF module in real time, if necessary.

In a word, the method and the RF provided in the embodiments of the present invention can enable a power amplifier to support multiple powers and satisfy the different application requirements by adjusting the output voltage that the power module supplies to the power amplifier module, according to the different application requirements. Thus, it is unnecessary to produce and maintain power amplifiers with different transmit powers. The power amplifier can be used more flexibly, the maintenance cost of the power amplifier is reduced, and the production and use of the power amplifier becomes easier.

Finally, it should be understood that the above embodiments are used to explain, but not to limit the technological solution. Despite describing the embodiments in detail, it should be understood that various modifications, changes or equivalent replacements could be made by an ordinary person skilled in the relevant field without departing from the spirit and scope of the technological solution, which should be covered in the extent of the claims.

What is claimed is:

1. A method for enabling a power amplifier to support multiple powers, comprising:

receiving radio frequency (RF) parameters delivered by a baseband board, wherein the RF parameters comprise a number of carriers that are to be amplified by the power amplifier and a power level of each of the carriers;

calculating a transmit power of the power amplifier according to the RF parameters, wherein the calculating the transmit power of the power amplifier according to the RF parameters comprises calculating a transmit power level according to the number of carriers that are to be amplified by the power amplifier and the power level of each of the carriers;

querying and reading a value of a supply voltage of the power amplifier corresponding to the transmit power obtained through the calculating from a list storing a corresponding relationship between a transmit power and a supply voltage of the power amplifier; wherein if the querying and reading succeed, determining the read value of the supply voltage of the power amplifier to be the value of the supply voltage of the power amplifier; and, if the querying and reading fail, determining a preset default value to be the value of the supply voltage of the power amplifier, wherein the supply voltage increases with increase of the transmit power of the power amplifier and decreases with decrease of the transmit power of the power amplifier; and adjusting the supply voltage of the power amplifier according to the determined value of the supply voltage of the power amplifier.

2. The method according to claim 1, wherein the adjusting the supply voltage of the power amplifier according to the determined value of the supply voltage of the power amplifier comprises:

determining coefficients for calculating a voltage control parameter, and calculating the voltage control parameter according to the coefficients for calculating the voltage control parameter and the determined value of the supply voltage of the power amplifier; and adjusting the supply voltage of the power amplifier according to the voltage control parameter.

3. The method according to claim 2, wherein the determining the coefficients for calculating the voltage control parameter comprises reading the coefficients for calculating the voltage control parameter from a power module, and if the reading fails, setting the coefficients for calculating the voltage control parameter to default values.

4. The method according to claim 1, wherein before calculating the transmit power according to the RF parameters, the method further comprises determining whether to enable a power-saving mode; if the power-saving mode is enabled, calculating the transmit power according to the RF parameters;

if the power-saving mode is disabled, reading a first supply voltage of the power amplifier from the corresponding relationship between the transmit power and the supply voltage of the power amplifier.

5. A radio frequency (RF) module, comprising:
a conversion module that converts a baseband board signal into an RF signals;
an antenna linear device;
a power amplifier;
a storage module, configured to store RF parameters delivered by a baseband board and a corresponding relationship between a transmit power and a supply voltage of the power amplifier, wherein the RF parameters delivered by the baseband board comprise a number of carriers that are to be amplified by the power amplifier and a power level of each of the carriers;
a power control module, configured to calculate a transmit power of the power amplifier according to the RF parameters stored in the storage module, and to query and read a value of a supply voltage of the power amplifier corresponding to the transmit power obtained through the calculating from a list that stores the corresponding relationship between the transmit power and the supply voltage of the power amplifier; wherein if the query and read succeed, the power control module determines the read value of the supply voltage of the power amplifier to be the value of the supply voltage of the power amplifier; and, if the query and read fail, the power control module determines a preset default value to be the value of the supply voltage of the power amplifier, wherein the supply voltage increases with increase of the transmit power of the power amplifier and decreases with decrease of the transmit power of the power amplifier; and
an adjustable power module, configured to supply the supply voltage of the power amplifier equivalent to the value of the supply voltage of the power amplifier determined by the power control module.

6. The RF module according to claim 5, wherein the storage module is further configured to store a switch value of a power-saving mode;
the power control module is further configured to determine whether to enable the power-saving mode according to the switch value of the power-saving mode.

7. The RF module according to claim 6, wherein the power module comprises:
a power amplifier power source, configured to supply power to the power amplifier;
a power control portion, configured to set an output voltage of the power amplifier power source according to a voltage control parameter determined by the power control module.

8. The RF module according to claim 7, wherein the power control portion is a parameter-adjustable chip connected to the power amplifier power source through a power cable and connected to the power control module through a bus.

9. The RF module according to claim 6, wherein the storage module is disposed in the power module, or is disposed outside the power module, or a part of the storage module is disposed in the power module and the other part of the storage module is disposed outside the power module;
the storage module is connected to the power control module through the bus.

10. The RF module according to claim 5, wherein the power module comprises:
a power amplifier power source, configured to supply power to the power amplifier;
a power control portion, configured to set an output voltage of the power amplifier power source according to a voltage control parameter determined by the power control module.

11. The RF module according to claim 10, wherein the power control portion is a parameter-adjustable chip connected to the power amplifier power source through a power cable and connected to the power control module through a bus.

12. The RF module according to claim 5, wherein the storage module is disposed in the power module, or is disposed outside the power module, or a part of the storage module is disposed in the power module and the other part of the storage module is disposed outside the power module;
the storage module is connected to the power control module through the bus.

* * * * *